(12) United States Patent
Palmer et al.

(10) Patent No.: US 7,664,166 B2
(45) Date of Patent: Feb. 16, 2010

(54) PLEISIOCHRONOUS REPEATER SYSTEM AND COMPONENTS THEREOF

(75) Inventors: Robert E. Palmer, Carrboro, NC (US); Thomas H. Greer, III, Chapel Hill, NC (US); Stephen G. Tell, Chapel Hill, NC (US)

(73) Assignee: Rambus Inc., Los Altos, CA (US)

( * ) Notice: Subject to any disclaimer, the term of this patent is extended or adjusted under 35 U.S.C. 154(b) by 785 days.

(21) Appl. No.: 11/013,945

(22) Filed: Dec. 17, 2004

(65) Prior Publication Data

US 2006/0133466 A1 Jun. 22, 2006

(51) Int. Cl.
*H04B 1/00* (2006.01)
(52) U.S. Cl. .................. 375/211; 375/212; 375/215; 375/219; 375/220; 375/316; 714/738; 714/712; 370/389; 370/506; 370/521
(58) Field of Classification Search ........... 375/211, 375/213–215, 219, 221, 226, 227, 354, 375, 375/376, 377, 295, 306, 316, 342–343, 355, 375/359, 360, 371; 714/724, 738; 331/11, 331/17, 18

See application file for complete search history.

(56) References Cited

U.S. PATENT DOCUMENTS

| | | | |
|---|---|---|---|
| 6,333,940 B1 * | 12/2001 | Baydar et al. | 370/506 |
| 6,469,583 B1 * | 10/2002 | Usui | 331/1 A |
| 6,956,922 B2 * | 10/2005 | Weldon et al. | 375/373 |
| 6,961,403 B1 * | 11/2005 | Austin et al. | 377/80 |
| 7,047,457 B1 * | 5/2006 | Black et al. | 714/712 |
| 7,093,177 B2 * | 8/2006 | West et al. | 714/738 |
| 7,336,755 B1 * | 2/2008 | Tetzlaff | 375/376 |
| 7,587,011 B2 * | 9/2009 | Smith et al. | 375/354 |
| 2002/0140512 A1 * | 10/2002 | Stockton | 331/11 |
| 2003/0035504 A1 * | 2/2003 | Wong et al. | 375/377 |
| 2003/0198311 A1 * | 10/2003 | Song et al. | 375/376 |

* cited by examiner

*Primary Examiner*—Shuwang Liu
*Assistant Examiner*—Hirdepal Singh
(74) *Attorney, Agent, or Firm*—Hunton & Williams LLP (57) ABSTRACT

A pleisiochronous repeater system and components thereof are disclosed. In one particular exemplary embodiment, a pleisiochronous repeater system component may be realized as a receiver circuit comprising a clock multiplier that multiplies a reference clock signal by an integer multiple to generate a data clock signal. The receiver circuit may also comprise a divider circuit that generates a timing reference signal having a frequency that is not an integer divisor of a frequency of the reference clock signal.

31 Claims, 4 Drawing Sheets

PLEISIOCHRONOUS REPEATER SYSTEM AND COMPONENTS THEREOF

FIELD OF THE DISCLOSURE

The present disclosure relates generally to high speed signaling and, more particularly, to a pleisiochronous repeater system and components thereof.

BACKGROUND OF THE DISCLOSURE

All traditional clock multipliers exhibit some residual phase modulation of a multiplied clock at the frequency of a reference clock signal. The process of clock recovery in a receiver or a transmitter will cause a phase error appearing on the multiplied clock to be sampled at a frequency that is equal to a timing reference signal. This sampled phase error appears directly on the phase of the timing reference signal. The magnitude of this phase error is a function of a phase difference between the timing reference signal and the reference clock signal at the sampling instant. The shape of the function is a characteristic intrinsic to the clock multiplier.

A transmitter clock recovery loop operates based upon phase differences between timing reference signals so any phase error between the timing reference signals that is within a pass band of a transmitter phase detector filter will appear as a phase offset in the transmitter clock recovery loop. The resulting phase offset from phase modulation of the timing reference signals will depend on relative amplitudes and phases of the modulation sources (e.g., the sampling of the phase error on the multiplied clock by timing reference generators). System variables such as the propagation delay of a receiver timing reference signal from a receiver to a transmitter, along with a reset behavior of timing reference clock dividers, would in practice affect the phase error appearing between the timing reference signals at the input to the transmitter phase detector filter.

Figure 1:
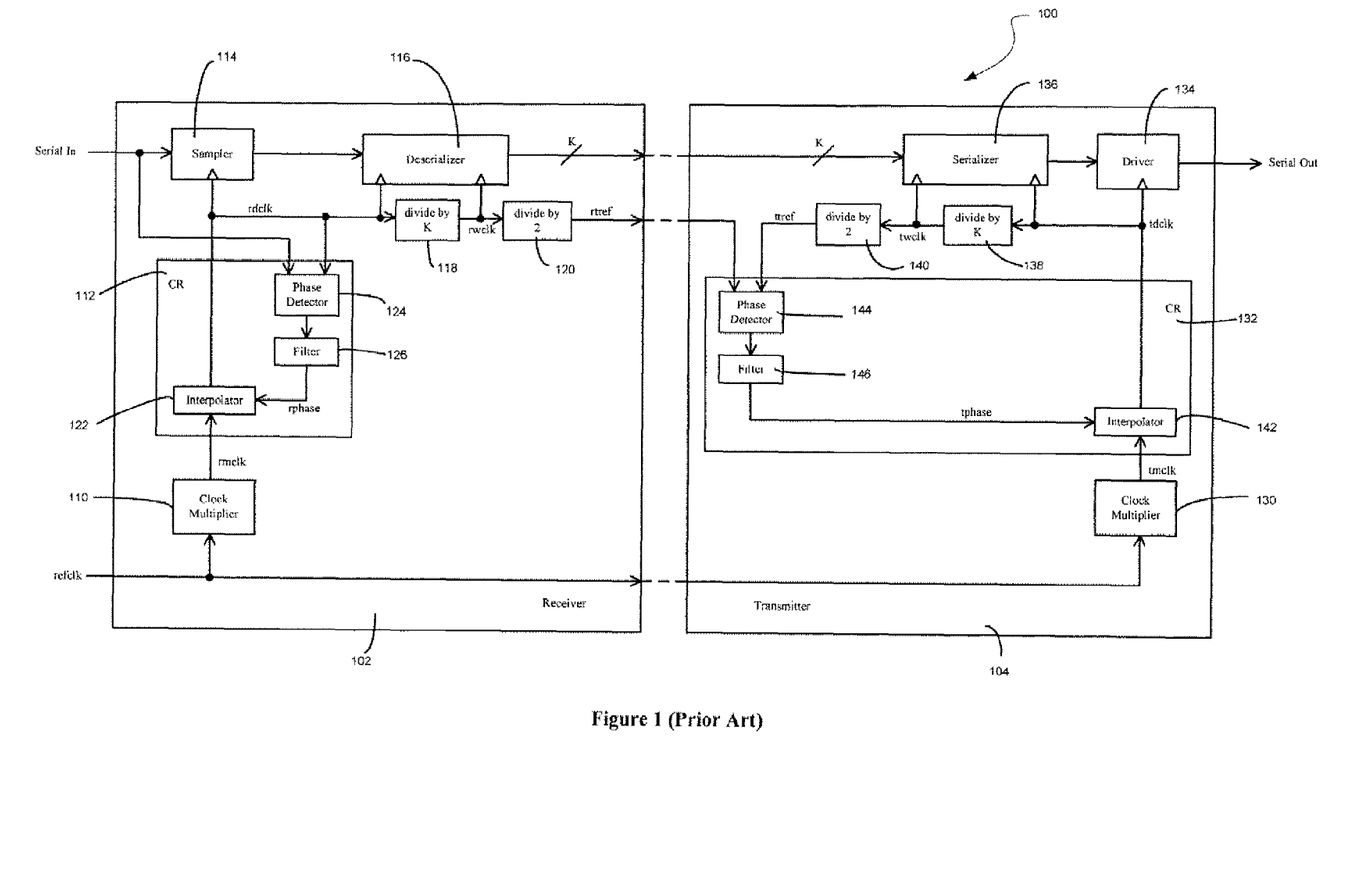
FIG. 1 shows an exemplary traditional pleisiochronous repeater system.

For example, referring to FIG. 1, there is shown an exemplary traditional pleisiochronous repeater system 100 comprising a receiver 102 and a transmitter 104. The receiver 102 comprises a clock multiplier 110, a clock recovery circuit 112, a sampler 114, a deserializer 116, a divide by K circuit 118, and a divide by 2 circuit 120. The clock recovery circuit 112 comprises an interpolator 122, a phase detector 124, and a filter 126. The transmitter 104 comprises a clock multiplier 130, a clock recovery circuit 132, a driver 134, a serializer 136, a divide by K circuit 138, and a divide by 2 circuit 140. The clock recovery circuit 132 comprises an interpolator 142, a phase detector 144, and a filter 146.

The receiver 102 receives a reference clock signal (refclk), which is multiplied by the clock multiplier 110 to generate a receiver multiplied clock signal (rmclk). The receiver multiplied clock signal (rmclk) is phase adjusted by the interpolator 122 based upon a receiver low frequency phase difference signal (rphase) to generate a receiver data clock signal (rdclk).

The receiver 102 also receives serial data, which is sampled by the sampler 114 using the receiver data clock signal (rdclk). The sampled serial data is deserialized by the deserializer 116 using the receiver data clock signal (rdclk), and a receiver word clock signal (rwclk) generated by the divide by K circuit 118. The deserializer 116 outputs a K-bit parallel data word. The receiver word clock signal (rwclk) is divided by the divide by 2 circuit 120, which outputs a receiver timing reference signal (rtref).

The serial data is also compared against the receiver data clock signal (rdclk) in the phase detector 124 in the clock recovery circuit 112 to determine if there is any phase difference therebetween. Any resulting high frequency phase difference components detected by the phase detector 124 are filtered out by the filter 126 in the clock recovery circuit 112, while any resulting low frequency phase difference components detected by the phase detector 124 are passed by the filter 126 in the clock recovery circuit 112. The filter 126 thus provides the receiver low frequency phase difference signal (rphase) to the interpolator 122.

The transmitter 104 receives the reference clock signal (refclk), which is multiplied by the clock multiplier 130 to generate a transmitter multiplied clock signal (tmclk). The transmitter multiplied clock signal (tmclk) is phase adjusted by the interpolator 142 based upon a transmitter low frequency phase difference signal (tphase) to generate a transmitter data clock signal (tdclk).

The transmitter 104 also receives a K-bit parallel data word either directly from the receiver 102 or from some intermediate circuitry (not shown). The received K-bit parallel data word is serialized by the serializer 136 using the transmitter data clock signal (tdclk), and a transmitter word clock signal (twclk) generated by the divide by K circuit 138. The serializer 136 outputs serial data to the driver 134, which outputs clocked serial data using the transmitter data clock signal (tdclk). The transmitter word clock signal (twclk) is divided by the divide by 2 circuit 140, which outputs a transmitter timing reference signal (ttref).

The transmitter 104 further receives the receiver timing reference signal (rtref) either directly from the receiver 102 or from some intermediate circuitry (not shown). The received receiver timing reference signal (rtref) is compared against the transmitter timing reference signal (ttref) in the phase detector 144 in the clock recovery circuit 132 to determine if there is any phase difference therebetween. Any resulting high frequency phase difference components detected by the phase detector 144 are filtered out by the filter 146 in the clock recovery circuit 132, while any resulting low frequency phase difference components detected by the phase detector 144 are passed by the filter 146 in the clock recovery circuit 132. The filter 146 thus provides the transmitter low frequency phase difference signal (tphase) to the interpolator 142.

In the traditional pleisiochronous repeater system 100, alignment of the transmitter word clock signal (twclk) with the K-bit parallel data word that is received at the transmitter 104 is attempted by forwarding phase information from the receiver 102 to the transmitter 104 using the receiver timing reference signal (rtref) which transitions at the same rate as the received K-bit parallel data word. However, when the frequency of the reference clock signal (refclk) is integer divisible by the frequency of the receiver timing reference signal (rtref) (e.g., one half the frequency of the received K-bit parallel data word), the receiver timing reference signal (rtref) is phase modulated at a frequency that is equal to an offset frequency of the serial data that is received at the receiver 102, with a modulation amplitude that is equal to the amplitude of phase modulation appearing on the receiver data clock signal (rdclk) at the frequency of the reference clock signal (refclk). For example, when the clock multiplier 110 has a multiplier value M that is equal to the product of the divider values for the divide by K circuit 118 and the divide by 2 circuit 120 (i.e., 2*K), the frequency of the receiver timing reference signal (rtref) is offset from the frequency of the reference clock signal (refclk) by an amount that is equal to the frequency of the reference clock signal (refclk) multiplied by a frequency difference between the frequency of the serial data that is received at the receiver 102 and the frequency of the receiver data clock (rdclk), divided by the frequency of the receiver data clock (rdclk) (e.g., if the frequency of the serial data is 2.5 GHz, and the frequency of the reference clock signal (refclk) is 156.25 MHz, then the frequency of the receiver timing reference signal (rtref) would be 156.28125 MHz). As mentioned above, in all traditional clock multipliers, phase modulation appearing on a multiplied clock is sampled at a frequency that is equal to a receiver timing reference signal, and appears on the receiver timing reference signal as a phase error. Thus, in this case, the phase error appearing on the receiver timing reference signal (rtref) traces out the phase modulation appearing on the receiver multiplied clock signal (rmclk) at a rate equal to the frequency offset between the receiver timing reference signal (rtref) and the reference clock signal (refclk). That is, the receiver interpolator 122 essentially traces out the phase error appearing on the receiver data clock signal (rdclk) as it rotates the phase of the receiver data clock signal (rdclk) to track the offset frequency of received serial data. The resulting phase modulation in the receiver timing reference signal (rtref) is extremely low frequency (e.g., 200 ppm of the received serial data rate), and passes through the filter 146 in the clock recovery circuit 132 in the transmitter 104. Phase modulation also occurs on the transmitter data clock signal (tdclk) and the transmitter word clock signal (twclk) when the transmitter clock recovery circuit 132 attempts to align the transmitter timing reference signal (ttref) to the receiver timing reference signal (rtref).

The phase modulation associated with the receiver timing reference signal (rtref) is detrimentally summed with the phase modulation associated with the transmitter data clock signal (tdclk) and the transmitter word clock signal (twclk) in the transmitter clock recovery circuit 132. A resulting modulation amplitude of the transmitter data clock signal (tdclk) and the transmitter word clock signal (twclk) will vary, depending on the relative phase relationship of the receiver timing reference signal (rtref) and the reference clock signal (refclk). This result is undesirable and often even unacceptable in many pleisiochronous repeater systems.

In view of the foregoing, it would be desirable to provide a pleisiochronous repeater system which minimizes or avoids the above-described inadequacies and shortcomings associated with traditional pleisiochronous repeater systems.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENT(S)

A pleisiochronous repeater system and components thereof are disclosed. In one particular exemplary embodiment, a pleisiochronous repeater system component may be realized as a receiver circuit comprising a clock multiplier that multiplies a reference clock signal by an integer multiple to generate a data clock signal. The receiver circuit may also comprise a divider circuit that generates, based at least in part upon the data clock signal, a timing reference signal having a frequency that is not an integer divisor of a frequency of the reference clock signal.

In accordance with another particular exemplary embodiment, a pleisiochronous repeater system component may be realized as a transmitter circuit comprising a clock multiplier that multiplies a reference clock signal by an integer multiple to generate a data clock signal. The transmitter circuit may also comprise a divider circuit for generating, based at least in part upon the data clock signal, a timing reference signal having a frequency that is not an integer divisor of a frequency of the reference clock signal.

In accordance with yet another particular exemplary embodiment, a pleisiochronous repeater system may comprise a receiver that receives serial input data, converts the serial input data into parallel output data, and generates a receiver timing reference signal having a frequency that is not an integer divisor of a frequency of a reference clock signal from which a receiver data clock signal is generated. The pleisiochronous repeater system may also comprise a transmitter that receives the parallel output data, converts the received parallel output data into serial output data, and generates a transmitter timing reference signal having a frequency that is not an integer divisor of a frequency of a reference clock signal from which a transmitter data clock signal is generated.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Figure 2:
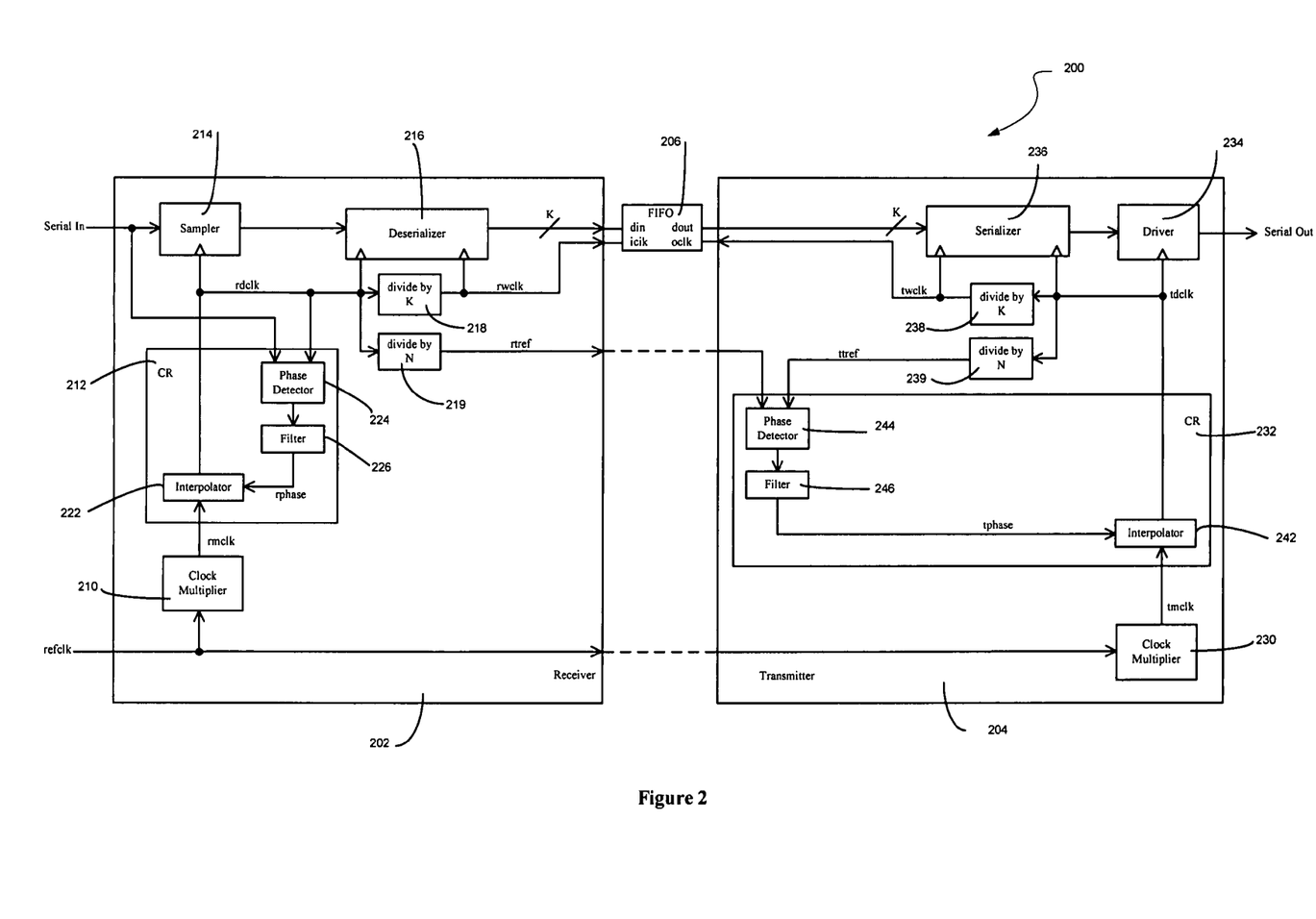
FIG. 2 shows a pleisiochronous repeater system in accordance with an embodiment of the present disclosure.

Referring to FIG. 2, there is shown a pleisiochronous repeater system 200 in accordance with an embodiment of the present disclosure. The system 200 of FIG. 2 comprises a receiver 202, a transmitter 204, and a first-in-first-out (FIFO) storage device 206 coupled between the receiver 202 and the transmitter 204. The receiver 202 comprises a clock multiplier 210, a clock recovery circuit 212, a sampler 214, a deserializer 216, a divide by K circuit 218, and a divide by N circuit 219. The clock recovery circuit 212 comprises an interpolator 222, a phase detector 224, and a filter 226. The transmitter 204 comprises a clock multiplier 230, a clock recovery circuit 232, a driver 234, a serializer 236, a divide by K circuit 238, and a divide by N circuit 239. The clock recovery circuit 232 comprises an interpolator 242, a phase detector 244, and a filter 246.

The receiver 202 receives a reference clock signal (refclk), which is multiplied by the clock multiplier 210 to generate a receiver multiplied clock signal (rmclk). The receiver multiplied clock signal (rmclk) is phase adjusted by the interpolator 222 based upon a receiver low frequency phase difference signal (rphase) to generate a receiver data clock signal (rdclk).

The receiver 202 also receives serial data, which is sampled by the sampler 214 using the receiver data clock signal (rdclk). The sampled serial data is deserialized by the deserializer 216 using the receiver data clock signal (rdclk), and a receiver word clock signal (rwclk) generated by the divide by K circuit 218. The deserializer 216 outputs a K-bit parallel data word to the FIFO 206, which also receives the receiver word clock signal (rwclk) generated by the divide by K circuit 218. The receiver data clock signal (rdclk) is divided by the divide by N circuit 219, which outputs a receiver timing reference signal (rtref).

The serial data is also compared against the receiver data clock signal (rdclk) in the phase detector 224 in the clock recovery circuit 212 to determine if there is any phase difference therebetween. Any resulting high frequency phase difference components detected by the phase detector 224 are filtered out by the filter 226 in the clock recovery circuit 212, while any resulting low frequency phase difference components detected by the phase detector 224 are passed by the filter 226 in the clock recovery circuit 212. The filter 226 thus provides the receiver low frequency phase difference signal (rphase) to the interpolator 222.

As mentioned above, the FIFO 206 receives the K-bit parallel data word from the deserializer 216, as well as the receiver word clock signal (rwclk) generated by the divide by K circuit 218. The FIFO 206 also receives a transmitter word clock signal (twclk) from the transmitter 204, as described in detail below. The FIFO 206 uses the receiver word clock signal (rwclk) to clock in the received K-bit parallel data word from the deserializer 216. The FIFO 206 uses the transmitter word clock signal (twclk) to clock out a K-bit parallel data word to the transmitter 204.

At this point it should be noted that the FIFO 206 may be replaced with one or more other types of intermediate circuitry coupled between the receiver 202 and the transmitter 204. For example, the FIFO 206 may be replaced by a processing device which processes K-bit parallel data words output by the deserializer 216 and provides processed K-bit parallel data words to the transmitter 204.

The transmitter 204 receives the reference clock signal (refclk), which is multiplied by the clock multiplier 230 to generate a transmitter multiplied clock signal (tmclk). The transmitter multiplied clock signal (tmclk) is phase adjusted by the interpolator 242 based upon a transmitter low frequency phase difference signal (tphase) to generate a transmitter data clock signal (tdclk).

As mentioned above, the transmitter 204 also receives a K-bit parallel data word from the FIFO 206. The received K-bit parallel data word is serialized by the serializer 236 using the transmitter data clock signal (tdclk), and the transmitter word clock signal (twclk) generated by the divide by K circuit 238. The serializer 236 outputs serial data to the driver 234, which outputs clocked serial data using the transmitter data clock signal (tdclk). The transmitter data clock signal (tdclk) is divided by the divide by N circuit 239, which outputs a transmitter timing reference signal (ttref).

The transmitter 204 further receives the receiver timing reference signal (rtref) either directly from the receiver 202 or from some intermediate circuitry (not shown). The received receiver timing reference signal (rtref) is compared against the transmitter timing reference signal (ttref) in the phase detector 244 in the clock recovery circuit 232 to determine if there is any phase difference therebetween. Any resulting high frequency phase difference components detected by the phase detector 244 are filtered out by the filter 246 in the clock recovery circuit 232, while any resulting low frequency phase difference components detected by the phase detector 244 are passed by the filter 246 in the clock recovery circuit 232. The filter 246 thus provides the transmitter low frequency phase difference signal (tphase) to the interpolator 242.

In the system 200 of FIG. 2, the period of the receiver timing reference signal (rtref) is chosen to be an odd multiple of serial data bit-periods, such that the frequency of the reference clock signal (refclk) is never an integer multiple of the frequency of the receiver timing reference signal (rtref). This choice pushes a phase modulation frequency of the receiver timing reference signal (rtref) up into a range that can be filtered out by the filter 246 in the clock recovery circuit 232 in the transmitter 204, thereby minimizing or avoiding the undesirable and even unacceptable consequences associated with traditional pleisiochronous repeater systems as described above.

Figure 4:
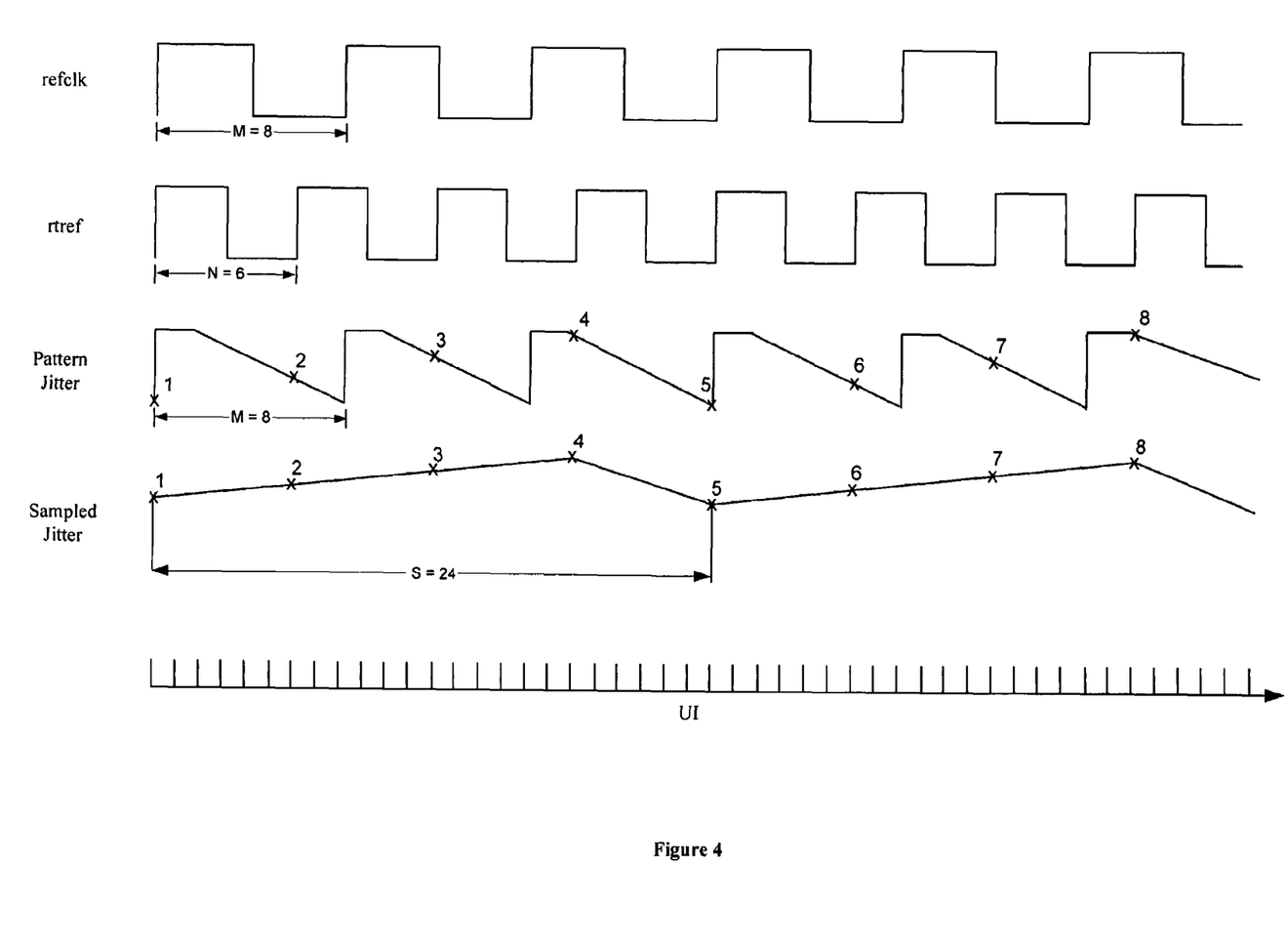
FIG. 4 shows a series of signal waveforms detailing an exemplary operation of the systems of FIGS. 2 and 3.

For example, referring to FIG. 4, there is shown a series of signal waveforms detailing an exemplary operation of the system 200 of FIG. 2. The horizontal axis is measured in unit intervals (UI), wherein one UI is the duration of a single serial data bit-period. The reference clock signal (refclk) has a period (M) of 8 UI, the receiver timing reference signal (rtref) has a period (N) of 6 UI, a pattern jitter signal (Pattern Jitter) has a period (M) of 8 UI, and a sampled jitter signal (Sampled Jitter) has a period (S) of 24 UI.

The pattern jitter signal (Pattern Jitter) represents a phase difference between the receiver data clock signal (rdclk) and the transmitter data clock signal (tdclk). The frequency (m) of the pattern jitter signal (Pattern Jitter) may be expressed as:

$$m = b/M$$

wherein b represents the data rate (i.e., the frequency of rdclk and tdclk) of the serial data, and M represents the multiplier value in the clock multiplier 210 in the receiver 202 and the clock multiplier 230 in the transmitter 204.

The sampled jitter signal (Sampled Jitter) represents a sampling of the pattern jitter signal (Pattern Jitter) on each rising edge of the receiver timing reference signal (rtref). The frequency (s) of the sampled jitter signal (Sampled Jitter) may be expressed as:

$$s = b/S = b((GCD(M,N))/(MN))$$

wherein b represents the data rate (i.e., the frequency of rdclk and tdclk) of the serial data, S represents the period of the sampled jitter signal (Sampled Jitter), M represents the multiplier value in the clock multiplier 210 in the receiver 202 and the clock multiplier 230 in the transmitter 204, N represents the divisor value in the divide by N circuit 219 in the receiver 202 and the divide by N circuit 239 in the transmitter 204, and GCD(M,N) represents the greatest common divisor of M and N. Thus, the frequency (s) of the sampled jitter signal (Sampled Jitter) may also be expressed as:

$$s = m((GCD(M,N))/N).$$

Also, the period (S) of the sampled jitter signal (Sampled Jitter) may be expressed as:

$$S = LCM(M,N) = (MN)/(GCD(M,N))$$

wherein M represents the multiplier value in the clock multiplier 210 in the receiver 202 and the clock multiplier 230 in the transmitter 204, N represents the divisor value in the divide by N circuit 219 in the receiver 202 and the divide by N circuit 239 in the transmitter 204, LCM(M,N) represents the least common multiple of M and N, and GCD(M,N) represents the greatest common divisor of M and N.

There are four main conditions for selecting the value of the divisor N in the divide by N circuit 219 in the receiver 202 and the divide by N circuit 239 in the transmitter 204, based upon the value of the multiplier M in the clock multiplier 210 in the receiver 202 and the clock multiplier 230 in the transmitter 204. First, the frequency (s) of the sampled jitter signal (Sampled Jitter) should be much higher than the bandwidth of the filter 246 in the clock recovery circuit 232 in the transmitter 204 so that the sampled jitter signal (Sampled Jitter) is filtered out by the filter 246 in the clock recovery circuit 232 in the transmitter 204. Second, the pattern jitter signal (Pattern Jitter) should be sampled in many different places so that the sampled jitter signal (Sampled Jitter) does not vary with a beat frequency of the system 200. This second condition may be expressed as:

$$M/(GCD(M,N))>4$$

wherein M represents the multiplier value in the clock multiplier 210 in the receiver 202 and the clock multiplier 230 in the transmitter 204, and GCD(M,N) represents the greatest common divisor of M and N. Third, N must be large enough that the transmitter timing reference signal (ttref) has a frequency that is low enough to reasonably propagate from the transmitter 204 to the receiver 202. Fourth, N must be small enough that the transmitter timing reference signal (ttref) has a frequency that is large enough for the clock recovery circuit 232 to track the offset frequency of received serial data.

Figure 3:
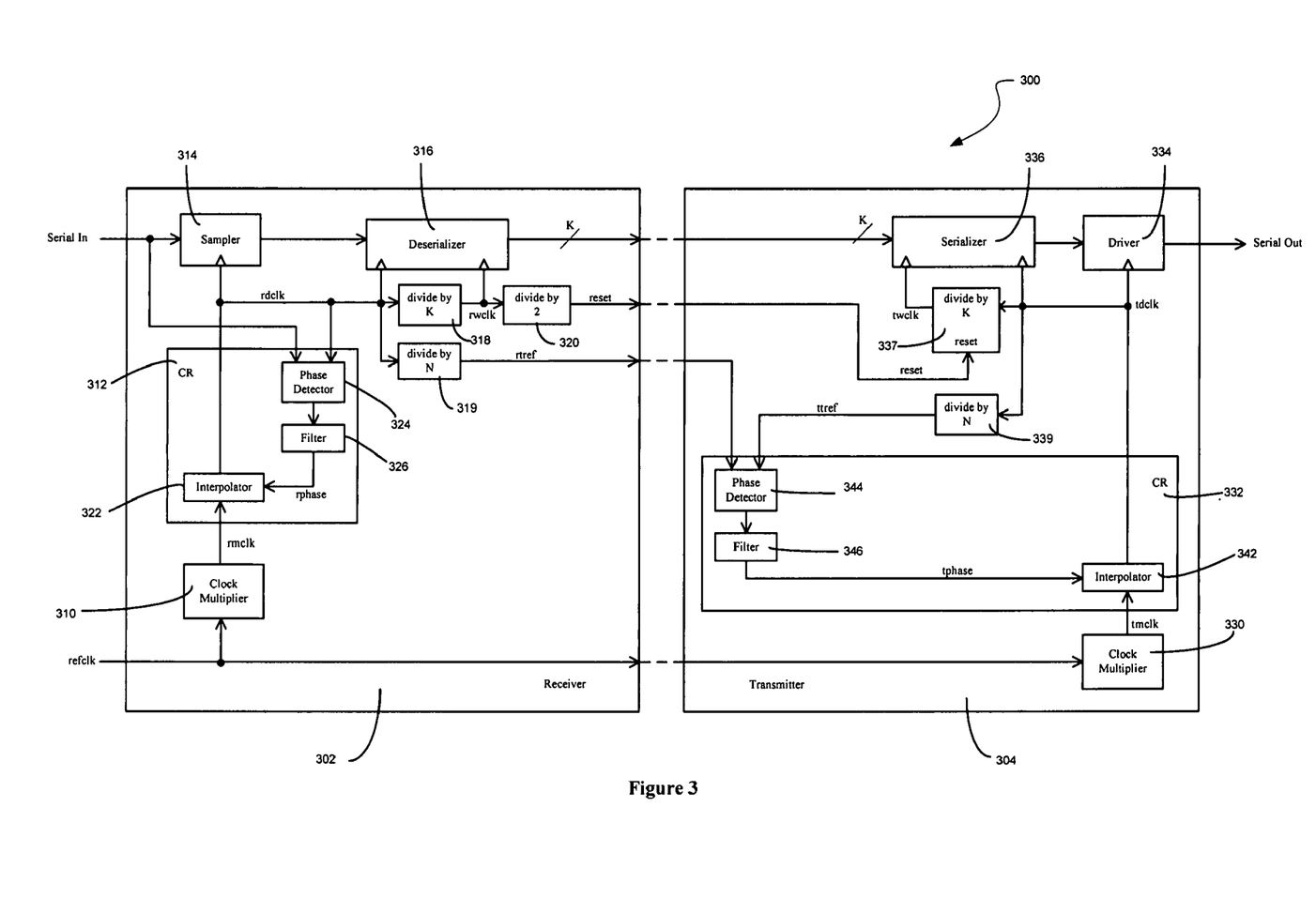
FIG. 3 shows a pleisiochronous repeater system in accordance with an alternative embodiment of the present disclosure.

Referring to FIG. 3, there is shown a pleisiochronous repeater system 300 in accordance with an alternative embodiment of the present disclosure. The system 300 of FIG. 3 comprises a receiver 302 and a transmitter 304. The receiver 302 comprises a clock multiplier 310, a clock recovery circuit 312, a sampler 314, a deserializer 316, a divide by K circuit 318, a divide by N circuit 319, and a divide by 2 circuit 320. The clock recovery circuit 312 comprises an interpolator 322, a phase detector 324, and a filter 326. The transmitter 304 comprises a clock multiplier 330, a clock recovery circuit 332, a driver 334, a serializer 336, a resetable divide by K circuit 337, and a divide by N circuit 339. The clock recovery circuit 332 comprises an interpolator 342, a phase detector 344, and a filter 346.

The receiver 302 receives a reference clock signal (refclk), which is multiplied by the clock multiplier 310 to generate a receiver multiplied clock signal (rmclk). The receiver multiplied clock signal (rmclk) is phase adjusted by the interpolator 322 based upon a receiver low frequency phase difference signal (rphase) to generate a receiver data clock signal (rdclk).

The receiver 302 also receives serial data, which is sampled by the sampler 314 using the receiver data clock signal (rdclk). The sampled serial data is deserialized by the deserializer 316 using the receiver data clock signal (rdclk), and a receiver word clock signal (rwclk) generated by the divide by K circuit 318. The deserializer 316 outputs a K-bit parallel data word. The receiver data clock signal (rdclk) is divided by the divide by N circuit 319, which outputs a receiver timing reference signal (rtref). The receiver word clock signal (rwclk) is divided by the divide by 2 circuit 320, which outputs a reset signal (reset).

The serial data is also compared against the receiver data clock signal (rdclk) in the phase detector 324 in the clock recovery circuit 312 to determine if there is any phase difference therebetween. Any resulting high frequency phase difference components detected by the phase detector 324 are filtered out by filter 326 in the clock recovery circuit 312, while any resulting low frequency phase difference components detected by the phase detector 324 are passed by filter 326 in the clock recovery circuit 312. The filter 326 thus provides the receiver low frequency phase difference signal (rphase) to the interpolator 322.

The transmitter 304 receives the reference clock signal (refclk), which is multiplied by the clock multiplier 330 to generate a transmitter multiplied clock signal (tmclk). The transmitter multiplied clock signal (tmclk) is phase adjusted by the interpolator 342 based upon a transmitter low frequency phase difference signal (tphase) to generate a transmitter data clock signal (tdclk).

The transmitter 304 also receives a K-bit parallel data word either directly from the receiver 302 or from some intermediate circuitry (not shown). The received K-bit parallel data word is serialized by the serializer 336 using the transmitter data clock signal (tdclk), and a transmitter word clock signal (twclk) generated by the resetable divide by K circuit 337. The serializer 336 outputs serial data to the driver 334, which outputs clocked serial data using the transmitter data clock signal (tdclk). The transmitter data clock signal (tdclk) is divided by the divide by N circuit 339, which outputs a transmitter timing reference signal (ttref).

The transmitter 304 further receives the receiver timing reference signal (rtref) either directly from the receiver 302 or from some intermediate circuitry (not shown). The received receiver timing reference signal (rtref) is compared against the transmitter timing reference signal (ttref) in the phase detector 344 in the clock recovery circuit 332 to determine if there is any phase difference therebetween. Any resulting high frequency phase difference components detected by the phase detector 344 are filtered out by the filter 346 in the clock recovery circuit 332, while any resulting low frequency phase difference components detected by the phase detector 344 are passed by the filter 346 in the clock recovery circuit 332. The filter 346 thus provides the transmitter low frequency phase difference signal (tphase) to the interpolator 342.

The system 300 of FIG. 3 operates similarly to the system 200 of FIG. 2, except that the system 300 of FIG. 3 does not necessarily comprise a FIFO coupled between the receiver 302 and the transmitter 304 (although a FIFO may comprise all or part of any intermediate circuitry coupled between the receiver 302 and the transmitter 304) and the receiver 302 generates the reset signal (reset) for the transmitter 304. As described above, the divide by 2 circuit 320 generates the reset signal (reset) from the receiver word clock signal (rwclk). The reset signal (reset) is used to reset the resetable divide by K circuit 337 so as to align the transmitter word clock signal (twclk) with the receiver word clock signal (rwclk).

At this point it should be noted that a pleisiochronous repeater system in accordance with the present disclosure as described above typically involves the processing of input data and the generation of output data to some extent. This input data processing and output data generation may be implemented in hardware or software. For example, specific electronic components may be employed in a receiver, transmitter, or similar or related circuitry for implementing the functions associated with a pleisiochronous repeater system in accordance with the present disclosure as described above. Alternatively, one or more processors operating in accordance with stored instructions may implement the functions associated with a pleisiochronous repeater system in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A receiver circuit comprising:
a clock multiplier that multiplies a reference clock signal by an integer multiple to generate a multiplied reference clock signal;
an interpolator that adjusts a phase of the multiplied reference clock signal based upon a phase difference between a data clock signal and serial input data to generate the data clock signal;
a first divider circuit that generates, based at least in part upon the data clock signal, a timing reference signal having a frequency that is not an integer divisor of a frequency of the reference clock signal; and
a second divider circuit, in parallel with the first divider circuit, that generates a word clock signal by dividing the data clock signal by an integer value corresponding to a parallel data width of the serial input data.

2. The receiver circuit of claim 1, further comprising:
a sampler that samples the serial input data based upon the data clock signal.

3. The receiver circuit of claim 2, further comprising:
a deserializer that deserializes the sampled serial input data based upon the data clock signal and the word clock signal so as to generate parallel output data having the parallel data width.

4. A transmitter circuit comprising:
a clock multiplier that multiplies a reference clock signal by an integer multiple to generate a multiplied reference clock signal;
an interpolator that adjusts a phase of the multiplied reference clock signal based upon a phase difference between a first timing reference signal and a second timing reference signal to generate a data clock signal;
a first divider circuit that generates, based at least in part upon the data clock signal, the first timing reference signal having a frequency that is not an integer divisor of a frequency of the reference clock signal; and
a second divider circuit, in parallel with the first divider circuit, that generates a word clock signal by dividing the data clock signal by an integer value corresponding to a parallel data width of parallel input data.

5. The transmitter circuit of claim 4, further comprising:
a serializer that serializes the parallel input data based upon the data clock signal and the word clock signal so as to generate serial output data.

6. The transmitter circuit of claim 5, further comprising:
a driver that clocks the serial output data based upon the data clock signal.

7. A pleisiochronous repeater system comprising:
a receiver that receives serial input data, multiplies a receiver reference clock signal by a first integer multiple to generate a multiplied receiver reference clock signal, adjusts a phase of the multiplied receiver reference clock signal based upon a phase difference between a receiver data clock signal and serial input data to generate the receiver data clock signal, converts the serial input data into parallel output data, generates a receiver timing reference signal having a frequency that is not an integer divisor of a frequency of the receiver reference clock signal, based at least in part upon the receiver data clock signal, and generates a receiver word clock signal, in parallel with the receiver timing reference signal, by dividing the receiver data clock signal by an integer value corresponding to a parallel data width of the parallel output data; and
a transmitter that receives the parallel output data, multiplies a transmitter reference clock signal by a second integer multiple to generate a multiplied transmitter reference clock signal, adjusts a phase of the multiplied transmitter reference clock signal based upon a phase difference between the receiver timing reference signal and a transmitter timing reference signal to generate a transmitter data clock signal, converts the received parallel output data into serial output data, generates the transmitter timing reference signal having a frequency that is not an integer divisor of a frequency of the transmitter reference clock signal, based at least in part upon the transmitter data clock signal, and generates a transmitter word clock signal, in parallel with the transmitter timing reference signal, by dividing the transmitter data clock signal by an integer value corresponding to a parallel data width of the received parallel output data.

8. The system of claim 7, wherein the receiver timing reference signal and the transmitter timing reference signal are compared to generate a transmitter phase difference signal.

9. The system of claim 8, wherein the transmitter comprises:
a clock multiplier that multiplies the transmitter reference clock signal by the second integer multiple to generate the multiplied transmitter reference clock signal.

10. The system of claim 9, wherein the transmitter further comprises:
an interpolator that adjusts the phase of the multiplied transmitter reference clock signal based upon the transmitter phase difference signal.

11. The system of claim 7, wherein the transmitter further comprises:
a first divider circuit that generates the transmitter timing reference signal.

12. The system of claim 11, wherein the transmitter further comprises:
a second divider circuit that generates the transmitter word clock signal.

13. The system of claim 12, wherein the second divider circuit is resetable.

14. The system of claim 12, wherein the transmitter further comprises:
a serializer that serializes the received parallel output data based upon the transmitter data clock signal and the transmitter word clock signal so as to generate the serial output data.

15. The system of claim 14, wherein the transmitter further comprises:
a driver that clocks the serial output data based upon the transmitter data clock signal.

16. The system of claim 7, wherein the receiver comprises:
a clock multiplier that multiplies the receiver reference clock signal by the first integer multiple to generate the multiplied receiver reference clock signal.

17. The system of claim 16, wherein the receiver further comprises:
a sampler that samples the serial input data based upon the receiver data clock signal.

18. The system of claim 17, wherein the receiver further comprises:
an interpolator that adjusts the phase of the multiplied receiver reference clock signal based upon the phase difference between the receiver data clock signal and the serial input data to generate the receiver data clock signal.

19. The system of claim 17, wherein the receiver further comprises:
a first divider circuit that generates the receiver timing reference signal.

20. The system of claim 19, wherein the receiver further comprises:
a second divider circuit that generates the receiver word clock signal.

21. The system of claim 20, wherein the receiver further comprises:
a third divider circuit that generates a reset signal based upon the receiver word clock signal for resetting a fourth divider circuit in the transmitter.

22. The system of claim 20, wherein the receiver further comprises:
a deserializer that deserializes the sampled serial input data based upon the receiver data clock signal and the receiver word clock signal so as to generate the parallel output data having the parallel data width.

23. The system of claim 7, wherein the receiver is coupled directly to the transmitter.

24. The system of claim 7, wherein the receiver is coupled to the transmitter through at least one intermediate circuit.

25. The system of claim 24, wherein the at least one intermediate circuit comprises a FIFO that receives the parallel output data from the receiver and provides the parallel output data to the transmitter.

26. A method for operating a receiver circuit, the method comprising:
multiplying a reference clock signal by an integer multiple to generate a multiplied reference clock signal;
adjusting a phase of the multiplied reference clock signal based upon a phase difference between a data clock signal and serial input data to generate the data clock signal;
generating, based at least in part upon the data clock signal, a timing reference signal having a frequency that is not an integer divisor of a frequency of the reference clock signal; and
generating a word clock signal, in parallel with the timing reference signal, by dividing the data clock signal by an integer value corresponding to a parallel data width of serial input data.

27. At least one processor readable storage medium for storing a computer program of instructions configured to be readable by at least one processor for instructing the at least one processor to execute a computer process for performing the method as recited in claim 26.

28. A method for operating a transmitter circuit, the method comprising:
multiplying a reference clock signal by an integer multiple to generate a multiplied reference clock signal;
adjusting a phase of the multiplied reference clock signal based upon a phase difference between a first timing reference signal and a second timing reference signal to generate a data clock signal;
generating, based at least in part upon the data clock signal, the first timing reference signal having a frequency that is not an integer divisor of a frequency of the reference clock signal; and
generating a word clock signal, in parallel with the timing reference signal, by dividing the data clock signal by an integer value corresponding to a parallel data width of parallel input data.

29. At least one processor readable storage medium for storing a computer program of instructions configured to be readable by at least one processor for instructing the at least one processor to execute a computer process for performing the method as recited in claim 28.

30. A method of operation in a pleisiochronous repeater system, the method comprising:
receiving serial input data;
multiplying a receiver reference clock signal by a first integer multiple to generate a multiplied receiver reference clock signal;
adjusting a phase of the multiplied receiver reference clock signal based upon a phase difference between a receiver data clock signal and serial input data to generate the receiver data clock signal;
converting the serial input data into parallel output data;
generating, based at least in part upon the receiver data clock signal, a receiver timing reference signal having a frequency that is not an integer divisor of a frequency of the receiver reference clock signal;
generating a receiver word clock signal, in parallel with the receiver timing reference signal, by dividing the receiver data clock signal by an integer value corresponding to a parallel data width of the parallel output data;
receiving the parallel output data;
multiplying a transmitter reference clock signal by a second integer multiple to generate a multiplied transmitter reference clock signal;
adjusting a phase of the multiplied transmitter reference clock signal based upon a phase difference between the receiver timing reference signal and a transmitter timing reference signal to generate a transmitter data clock signal;
converting the received parallel output data into serial output data;
generating, based at least in part upon the transmitter data clock signal, the transmitter timing reference signal having a frequency that is not an integer divisor of a frequency of the transmitter reference clock signal; and
generating a transmitter word clock signal, in parallel with the transmitter timing reference signal, by dividing the transmitter data clock signal by an integer value corresponding to a parallel data width of the received parallel output data.

31. At least one processor readable storage medium for storing a computer program of instructions configured to be readable by at least one processor for instructing the at least one processor to execute a computer process for performing the method as recited in claim 30.

* * * * *

UNITED STATES PATENT AND TRADEMARK OFFICE
CERTIFICATE OF CORRECTION

PATENT NO. : 7,664,166 B2 Page 1 of 1
APPLICATION NO. : 11/013945
DATED : February 16, 2010
INVENTOR(S) : Palmer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1398 days.

Signed and Sealed this

Twenty-eighth Day of December, 2010

David J. Kappos
*Director of the United States Patent and Trademark Office*